(12) United States Patent
Smith

(10) Patent No.: US 10,466,288 B2
(45) Date of Patent: Nov. 5, 2019

(54) FIBER OPTIC PULSED POLARIMETRY

(71) Applicant: Roger Smith, Bainbridge Island, WA (US)

(72) Inventor: Roger Smith, Bainbridge Island, WA (US)

(*) Notice: Subject to any disclaimer, the term of this patent is extended or adjusted under 35 U.S.C. 154(b) by 343 days.

(21) Appl. No.: 15/428,892

(22) Filed: Feb. 9, 2017

(65) Prior Publication Data
US 2017/0227588 A1    Aug. 10, 2017

Related U.S. Application Data

(60) Provisional application No. 62/293,441, filed on Feb. 10, 2016.

(51) Int. Cl.
*G01R 29/08*    (2006.01)
*G01R 33/032*    (2006.01)

(52) U.S. Cl.
CPC ....... *G01R 29/0885* (2013.01); *G01R 33/032* (2013.01)

(58) Field of Classification Search
CPC .................. G01R 29/0885; G01R 33/032
USPC ...................... 324/244.1; 356/73.1
See application file for complete search history.

(56) References Cited

U.S. PATENT DOCUMENTS

| | | | | |
|---|---|---|---|---|
| 5,991,479 A | * | 11/1999 | Kleinerman | G01J 5/08 250/227.11 |
| 2003/0048499 A1 | * | 3/2003 | Alfano | H04B 10/1121 398/5 |
| 2004/0002199 A1 | * | 1/2004 | Fukuyo | B23K 26/03 438/460 |
| 2009/0244522 A1 | * | 10/2009 | Cyr | G01M 11/3181 356/73.1 |
| 2015/0128706 A1 | * | 5/2015 | Godfrey | G01D 5/35358 73/574 |

* cited by examiner

*Primary Examiner* — Farhana A Hoque

(57) ABSTRACT

This disclosure is directed to fiber optic pulsed polarimeters based on either streak camera or photodiode detection using a backscatter tailored optical fiber and the polarization optical time domain reflectometry technique for conducting remote diagnostic measurements of inducing fields along the fiber. The backscatter tailored optical fiber comprises a single mode fiber with an array of fiber Bragg gratings written to produce a predetermined distribution of backscatter signal in intensity and spectral content in response to a pulse propagating along the array. The fiber optic pulsed polarimeter includes a directional coupler that diverts the backscatter from the backscatter-tailored optical fiber to a polarization detection system for determining the polarization state of the backscatter as the polarized light pulse transits the backscatter-tailored optical fiber.

20 Claims, 6 Drawing Sheets

FIBER OPTIC PULSED POLARIMETRY

CROSS-REFERENCE TO RELATED APPLICATION

This application claims the benefit of Provisional Application No. 62/293,441, filed Feb. 10, 2016.

TECHNICAL FIELD

This disclosure is directed to systems and methods to measurements of magnetic and electric fields along an optical fiber.

BACKGROUND

At present, there is a demand for better magnetic field sensing in the field of magnetically confined plasmas or magnetized fusion science. A measurement technique able to resolve the magnetic field on a sub-mm spatial scale with field sensitivities spanning a milli-Tesla to 100 Tesla range is needed.

Magnetic fields are generated by electrical currents. Plasmas are electrical and, therefore, magnetic in nature. In demanding applications, with the characteristics of small size, electrically insulating, optically coupled with direct field detection from direct current to very high bandwidths possessed by optical fibers, most of the unmet demands of local magnetic sensing can be realized. Optical fiber magnetic sensing can expand the range of field sensing far outside the present range to such disciplines as magnetized plasmas, condensed matter, superconducting magnet technology and the medical field where the complexity and the dynamics of the magnetic field interactions with matter are of paramount importance.

DETAILED DESCRIPTION

A. Fiber Optic Pulsed Polarimetry

This disclosure is directed to fiber optic pulsed polarimeters that may be used to conduct remote diagnostic measurements of distributions of inducing fields, such as a component of a magnetic field or electric field, or a scalar field such as temperature along a backscatter tailored optical fiber. A fiber optic pulsed polarimeter ("FOPP") comprises a light source configured to emit a polarized light pulse having sufficiently narrow spatial extent at a prescribed wavelength coupled through a fiber optic splitter to a backscatter tailored optical fiber placed within the volume of space containing the field to be measured. The backscatter tailored optical fiber ("BTOF") is a custom fiber with an array of discrete fiber Bragg gratings that significantly increases the level of back reflected energy along the fiber. The back reflected light from the backscatter tailored optical fiber is returned to the splitter and directed to a polarization detector. The remote region where the magnetic field is measured at any distance from the light source and detector connected by a single mode optical fiber to transport the pulse of light from the source and back to the fiber splitter. Typically, the backscatter tailored optical fiber is used in a high voltage or hazardous area tens of meters from the FOPP instrument. The polarization detection system measures the intensity and the polarization state of the backscatter which can be used to determine the inducing magnetic, electric or temperature field along the length of the backscatter tailored optical fiber.

Figure 3:
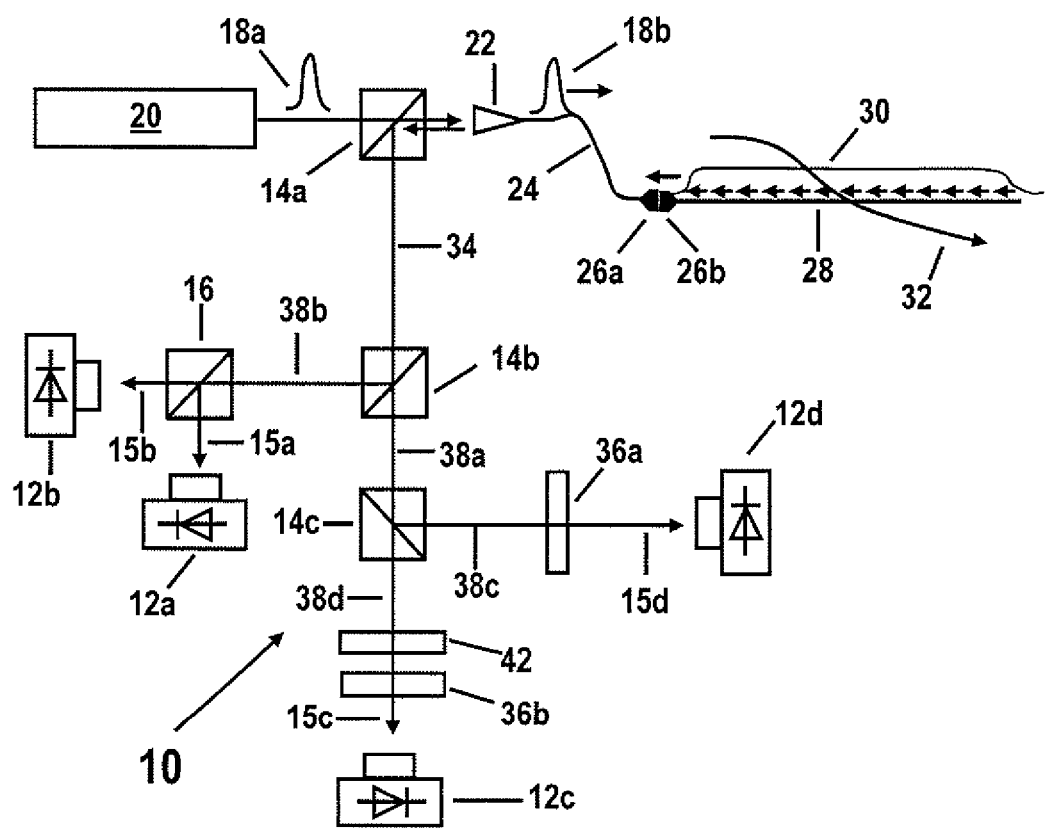
FIG. 3 shows a schematic representation of a fiber optic pulsed polarimeter with a backscatter tailored optical fiber placed in a region of a magnetic field.

The polarimeter is based on photodiode detectors with laser pulse energy at or below a 100 nJoule level and high laser repetition rates of about one million pulses per second or higher. An embodiment of an FOPP instrument is shown in FIG. 3. This instrument can provide a spatial resolution of 3-5 mm given the time response of fast photodiodes ($\tau$=30-50 ps) but also providing high temporal bandwidth, $BW_{temporal}$ to resolve field dynamics through the use of a high repetition rate, $R_{laser}$, laser. A high repetition rate laser cannot generate pulse energies sufficient for FOPP using fiber Rayleigh backscatter, but with the high backscatter levels of a BTOF, high rep lasers can be used to make robust measurements of the magnetic field (i.e., B field) on fast time scales. Lasers providing 50 million pulses/s ($R_{laser}$=50 MHz) are available which can resolve the plasma dynamics on a 20 ns time scale. Since there can be only one pulse in the array at one given time, $R_{laser}$ and the length of the array, L, are linked by (100 m-MHz/L)>$R_{laser}$. An array of 1 m length constrains $R_{laser}$ to be less than 100 MHz. A single pulse provides a 'snap-shot' of the magnetic field distribution in the region of interest. The B field should be steady or 'quasi-static' over the pulse transit time over the fiber, Lx(10 ns/m). This fiber optic pulsed polarimetry system can provide 330 near continuous space-time measurements of $B_{\|}(s_i, t_j)$ per meter, $\Delta s_i$=3 mm, at a rate of one field distribution per 20 ns, with $B_{\|}(s_i,t_j)$ resolved to better than 1 part in 1000 for fields typical of MFE science.

FIG. 3 shows a schematic representation of a fiber optic pulsed polarimeter with polarimeter 10 using photodiode detectors 12a-d. The BTOF 28 is placed in a region of a magnetic field 32 and connected to the instrument with polarization maintaining single mode fiber 24. The polarimeter 10 is a four channel Stokes vector polarimeter. The state of polarization of the backscatter, both the polarization azimuth, $\psi$, and the ellipticity, $\chi$, angles as well as the degree of polarization are fully determined by the polarimeter 10 along the BTOF 28. The polarimetry part of the instrument includes a light source 20 producing a spatially localized polarized pulse of light 18a, a directional coupler 14a, and a polarimeter 10. The directional coupler 14a can be a non-polarizing beam splitter. The light source 20 is in a pure linear polarization state. Some fraction (50%) of the polarized pulse 18a is transmitted through the directional coupler 14a into a free space to fiber collimator 22 which couples the beam into a single mode polarization maintaining single mode fiber 24. The fiber 24 transports the light pulse to the BTOF 28, which is positioned within the magnetic field 32. The two fibers 24 and 28 are coupled together with fiber connectors 26a-b. The BTOF 28 produces a spatially extended backscatter pulse 30 composed of a sequence of retro-reflections from the fiber Bragg gratings ("FBGs") in the array of the BTOF 28. The backscatter pulse 30 is launched by the free space to fiber collimator 22 into the directional coupler 14a and 50% is diverted toward the polarimeter 10. The collimated backscatter pulse 34 is split into two beams 38a-b using a non-polarizing beam splitter 14b. The beam 38b is analyzed using a polarizing beam splitter 16 that spatially separates the collimated backscatter beam 38b into two mutually orthogonal collimated analyzed beams of the linear polarized states, vertically polarized 15a and horizontally polarized 15b. The collimated output beams, 15a-b are directed onto detectors 12a-b producing electrical signals (voltage or current) proportional to the intensity of the beams 15a-b. The polarization azimuth, ψ, of the collimated beam 38b relative to the polarization state of the light source 20 is measured which yields both the first and second components of the Stokes vector. The beam 38a is split into two collimated beams 38c-d with the non-polarizing beam splitter 14c. Beam 38c is analyzed with a linear polarizer 36a set at 45° angle to horizontal producing the analyzed beam 15d that is linearly polarized at 45°. The beam 15d is directed onto detector 12d, producing an electrical signal proportional to the intensity of the collimated beam 15d which yields the third component of the Stokes vector. The collimated beam 38d is sent through a ¼ wave plate 42 with the slow axis of the collimated beam 38b oriented horizontal and analyzed using a linear polarizer 36b set to 45° to horizontal and directed onto detector 12c, which produces an electrical signal proportional to the intensity of the beam and yields a measurement of the intensity of the circularly polarized content of the collimated backscatter pulse 34 the fourth component of the Stokes vector. The four Stokes vector components for a calibrated polarimeter gives a complete description of the state of polarization ("SOP") of the backscattered light 34 which, in general, is elliptically polarized with some fraction, (1−p), of unpolarized light. In general, for fibers, p is 1, the unpolarized intensity is small or zero.

Figure 4:
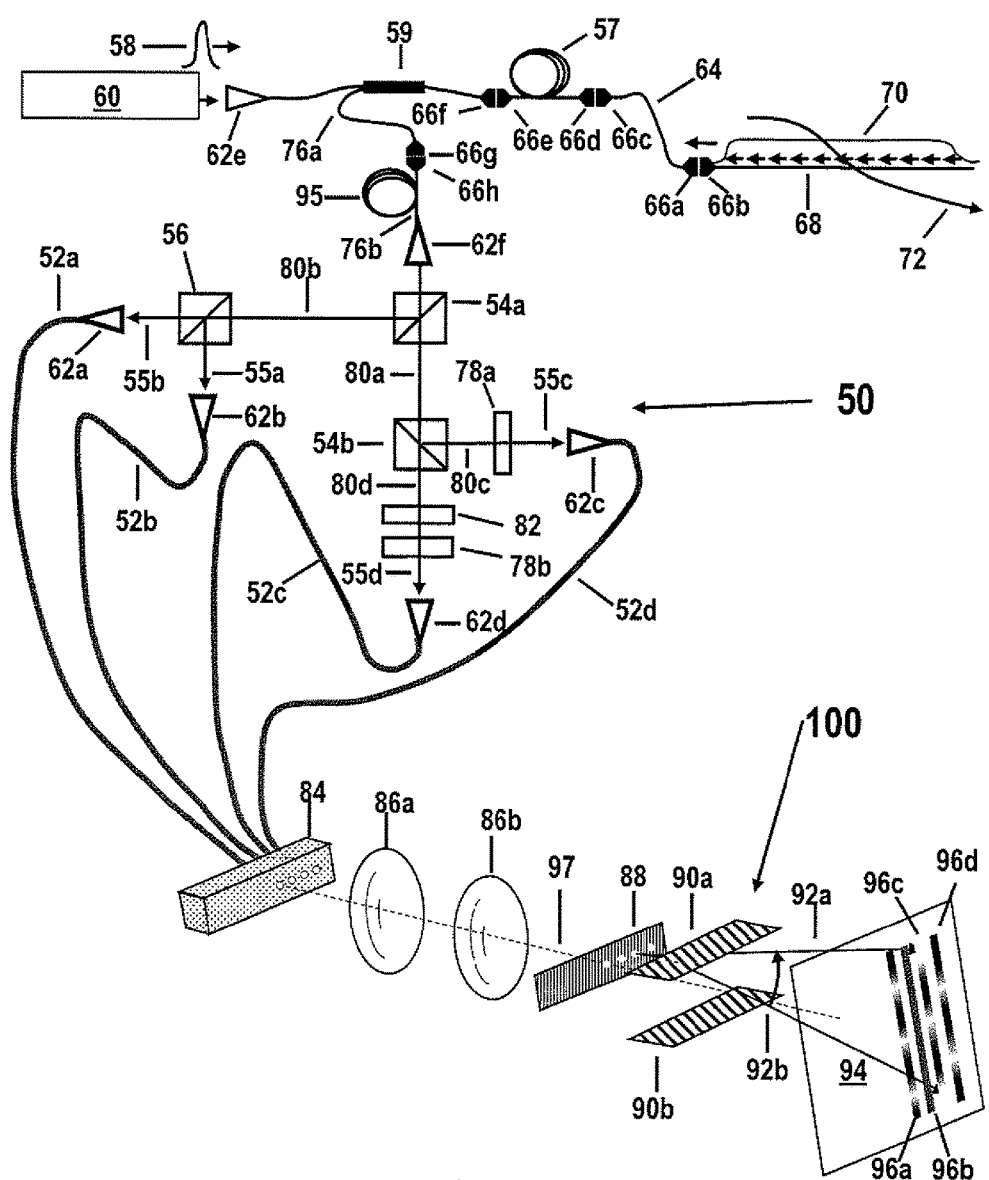
FIG. 4 shows a schematic representation of a fiber optic pulsed polarimeter with a backscatter tailored optical fiber placed in a region of a magnetic field and a streak camera.

FIG. 4 shows a schematic representation of a fiber optic pulsed polarimeter with the polarimeter 50 using a streak camera detector 100. The backscatter tailored optical fiber 68 is placed in a region of a magnetic field 72 and connected to the instrument with polarization maintaining single mode fiber 64. This embodiment of a fiber optic pulsed polarimeter has the potential for an exceptionally high spatial resolution of 0.1 mm (100 μm) due to the 1 ps response time of streak cameras. The light source is single pulse or of a rep rate that matches the acquisition rate of the streak camera, typically 1 kHz or less. The dynamics of the plasma can be obtained by using several fibers, each given fiber optic delays before the BTOF and equalizing fiber optic delays after the BTOF to bring the backscatter from the fibers into coincidence when the streak is taken. In this way, the dynamics of the plasma over a 100 ns period with field distributions recorded every 10 ns say can be obtained using 11 BTOFs. Field mapping at a specific time can also be accomplished using several BTOFs at different locations but have the same fiber delays.

Streak camera detection incorporates a four channel Stokes vector polarimeter 50. The polarimetry includes a light source 60 that produces a spatially localized polarized pulse of light 58, which is coupled into a SMF fiber optic splitter 59 using a free space to fiber collimator 62e and a polarimeter 50. Some fraction (50%) of the polarized pulse 58 is transmitted through the fiber splitter 59 and coupled into a before measurement polarization maintaining SMF fiber delay 57 using fiber connectors 66e-f. The light pulse is then coupled into a polarization maintaining optical fiber 64 via fiber connectors 66c-d to transport the light to the BTOF 68 and the region where the magnetic field 72 is to be measured with the BTOF 68. The fiber 64 is coupled to the BTOF using fiber connectors 66a-b. The BTOF 68 produces a spatially extended backscatter pulse 70 composed of a sequence of retro-reflections from the array of FBGs. The backscatter pulse 70 propagates back to the SMF splitter 59 and approximately 50% is diverted toward the polarimeter 50 in the splitter port 76a. The backscatter pulse in the splitter port 76a is connected to an after measurement polarization maintaining SMF optic delay 95 using fiber connectors 66g-h. The backscatter light pulse 76b after the delay 95 is then launched as a collimated beam into the polarimeter 50 using a free space to fiber collimator 62f. The collimated beam is split into two beams 80a-b using a non-polarizing beam splitter 54a. The beam 80b is analyzed using a polarizing beam splitter 56 into two mutually orthogonal collimated analyzed beams of the linear polarized states, a vertically polarized beam 55a and a horizontally polarized beam 55b. These are the first and second components of the Stokes vector. The collimated output beams 55a-b are directed into free space to fiber collimators 62a-b which couple the light into multi-mode fibers 52a-b which transport the light to the streak camera mechanical mount 84 where the output of the fiber is positioned for sourcing light to the streak camera. The polarization azimuth angle, ψ, of the collimated beam 80b relative to the polarization state of the light source 60 yields the first and second components of the Stokes vector and is directly related to the Faraday rotation along the BTOF due to the presence of a magnetic field. The sum intensities of the two 55a-b intensities yields the first Stokes vector component (total intensity). The beam 80a from the non-polarizing beam splitter 54a is split into two collimated beams 80c-d with the non-polarizing beam splitter 54b. Beam 80c is analyzed to collimated beam 55c with a linear polarizer 78a set at 45° to horizontal and coupled as a linearly polarized beam at 45° into the multi-mode fiber 52c using the free space to fiber collimator 62c. The fiber 52c then transports the analyzed light 55c to the streak camera mechanical mount 84, where the output of the fiber is positioned for sourcing light to the streak camera. The analyzed beam 55c will yield the third component of the Stokes vector. The collimated beam 80d is sent through a ¼ wave plate 82 with its slow axis oriented to be horizontal and analyzed using a linear polarizer 78b set to 45° to horizontal, the analyzed collimated beam 55d is in a circular polarized stated and is the fourth component of the Stokes vector. The beam 55d is directed into a free space to fiber collimator 62d. The multi-mode fiber 62d then transports the light to the streak camera mechanical mount 84, where the output of the fiber is positioned for sourcing light to the streak camera. The analyzed beam 55d yields a measurement of the intensity of the circularly polarized content of the backscatter pulse 70 the fourth component of the Stokes vector. The streak camera mechanical mount 84 provides the mechanical restraint and positioning to image the output light from the fibers, 52a-d, onto the streak camera photo-cathode surface 88 using the two lenses 86a-b, which collimate the four point sources of light from the fibers 52a-d and lens 86b, which focuses the collimated light from lens 86a onto the streak camera photo-cathode surface. This is a relay lens system which allows the two lenses 86a-b to be separated by an arbitrary distance along the optic axis 97. The photo-cathode surface 88 produces a streak camera electron beam illustrated for one light source by 92a-b, which shows the electron beam at the start of the streak at the bottom 92a and at the top of the streak 92b produced by a voltage difference between deflection plates 90a-b. The electron beams terminate on the streak camera phosphor screen 94, producing four fluorescing streaks 96a-d corresponding to the four intensities 55a-d, from the polarimeter 50. The four streaks 96a-d are fluorescent intensities patterns that directly relate to the distributed four Stokes vector components which yield the SOP of the backscattered light over the streak duration and resolved to the time response of the streak camera, 100.

Figure 5:
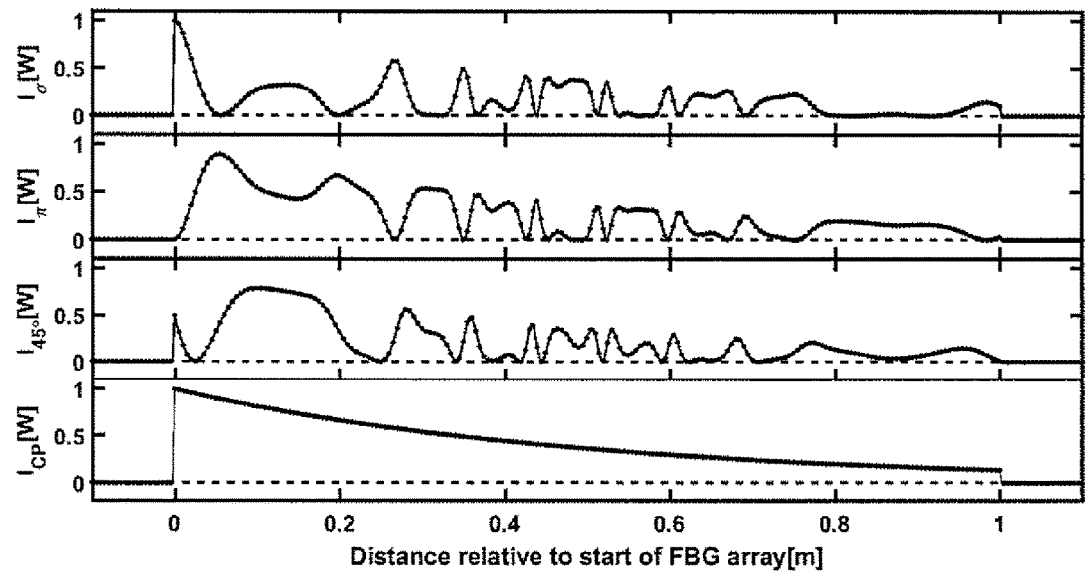
FIG. 5 shows Stokes vector polarimeter raw intensity signals of a fiber optic pulsed polarimeter with a backscattered tailored optical fiber as sampled data input to reconstruct a Faraday rotation angle and distributed magnetic field along the fiber.
Figure 6:
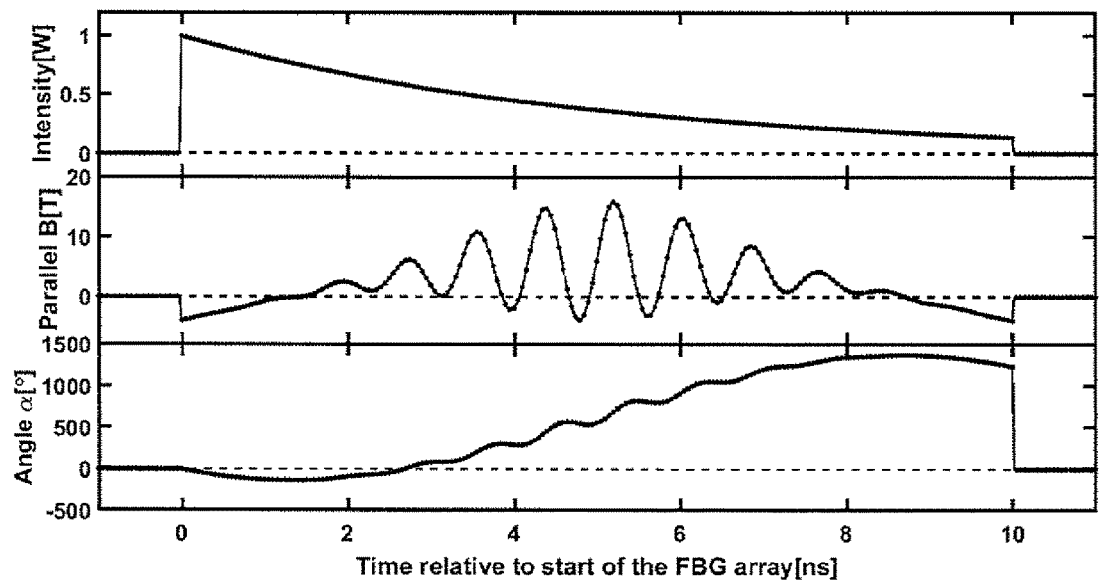
FIG. 6 shows the reconstructed Faraday rotation angle, parallel magnetic field and backscatter intensity distribution from a polarimeter.
Figure 7:
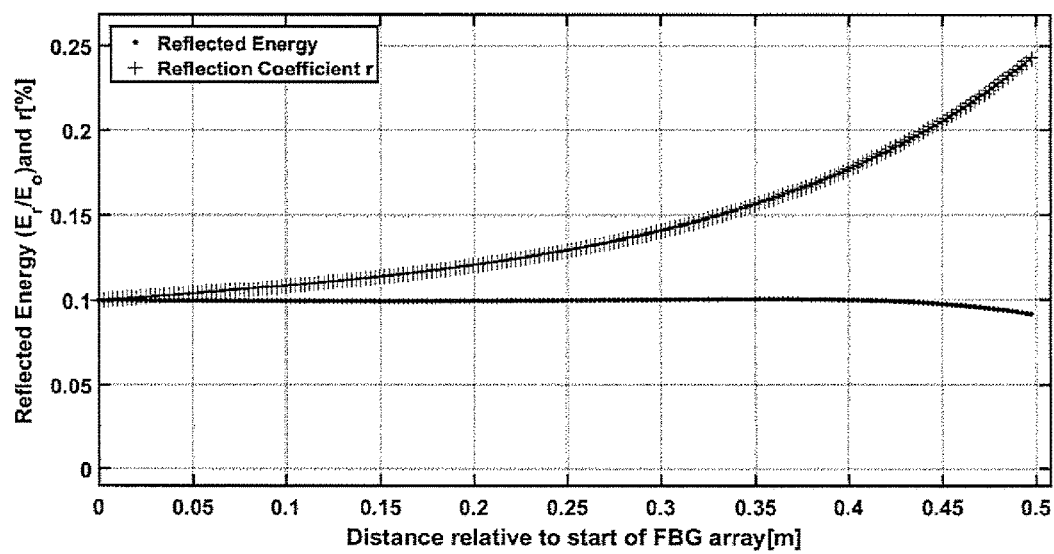
FIG. 7 shows a mathematical realization of a backscatter tailored optical fiber array with reflection coefficients that increase reflection with distance to produce a flat reflected energy distribution.

The raw intensities from the Stokes vector polarimeter from the photodiode detectors or from the streak camera are illustrated in FIG. 5. Four intensities are measured: 1) the two intensities $I_\pi$ and $I_o$ determine the linearly polarized state intensities contained in the backscatter, they are used to calculate both the polarization azimuth, w, and the total backscatter intensity $I_o$, for a calibrated polarimeter, 2) the linearly polarized state intensity, $I_{45°}$ content of the backscatter is used in the determination of the fraction of unpolarized light or degree of polarization and 3) the circularly polarized state intensity, $I_{CP}$, content of the backscatter which determines the ellipticity angle, $\chi$. The four Stokes vector components for a calibrated polarimeter completely determine the polarization state and degree of polarization of the distributed backscatter. From these intensities, the Faraday rotation can be deduced along the array. For this illustration, the circularly polarized state content is zero or $\chi=0$ and $\psi$ is equal to $\alpha_F$, which is shown in FIG. 6 along with the deduced parallel magnetic field distribution and total intensity trace $I_o$ over the array. Only half the points along the trace were plotted, 200 of the 400 FBG reflections. The Faraday rotation angle approaches 1500° whereas the angular resolution is 0.1° which illustrates that the dynamic range for a system that measures angles can be very high, 15,000:1. One just has to have enough measurements along the array to keep track of the angle. If the fiber had demonstrated linear birefringence then the ellipticity angle $\chi$ would not be zero and $\alpha_F$ would is derived using both, $\chi$ and $\psi$. In general, the fiber has some distributed birefringence which is taken into account by measuring the polarization of the back scatter without the magnetic field present first and then measuring the polarization with the magnetic field relative to this baseline. There is a vast and extensive literature on methods to analyze the four intensity traces to retrieve the Faraday rotation signal due to a long 35-year history of the POTDR technique. One can see that the raw traces in FIG. 5 are dropping in value over the array due to an exponentially decreasing intensity from the array. In FIG. 7, a flat reflected energy distribution is shown based on an increasing reflection coefficient with distance that starts with an $r_1=0.1\%$ and climbs to $r_N \sim 0.25\%$ close to an exponential rise in shape. In this case, the reflection coefficients are different and specified by, $r_i$, i=1, 2 ... N. The array runs out of energy at 0.5 m with 200 FBGs and the reflection coefficients beyond 0.5 m increases sharply in magnitude. This is a working design that can be used to produce a flat distribution backscatter-tailored optical fiber over any L.

B. Relevance of Magnetized Fusion Energy Science

In the field of plasma physics, relevant to magnetic fusion, the magnetic field distribution external to the plasma is generally accessible and its determination has been a key component to understanding the magnetohydrodynamic ("MHD") stability, energy transport and optimizing machine operations on magnetic confinement devices. If measured thoroughly, the external magnetic field provides a non-intrusive data set that provides the feedback necessary to control the coupling between the magnetically confined plasma and the external circuits or ('driver') that impose confinement. These drivers generate and confine the plasma configuration just as an electrical power circuit is optimized to transfer maximum power to a load by impedance matching. In this case the degrees of freedom are continuous and distributed magnetic sensing in the vacuum region adjacent to the plasma is necessary. There are also power sources that couple only to the plasma internally, such as neutral beam injectors ("NBI") that heat the plasma ions to thermonuclear temperatures. This creates an external magnetic response which if measured well, is used to control and operate the device. Magnetic field sensing has traditionally been carried out using discrete inductive pickup probes which cannot provide adequate coverage of the boundary magnetic fields for present and planned devices. Fiber optic sensing represents a technology that can better perform this task and has manifold potential for the Magnetic Fusion Energy ("MFE") community now and into the future.

Since the 1950's, a major international collaboration has developed employing many hundreds of scientists worldwide to understand the dynamics of magnetic confinement of plasmas with the goal of achieving controlled thermonuclear fusion. The subject is of immense importance since the field has a direct impact on the future energy resources available to society. Plasmas reaching fusion conditions represent objects with temperatures ten times the core temperature of the Sun, 100 million ° K, and a hostile radiation environment from the fusion reactions. These conditions are being pursued under a number of different experimental configurations at several US National laboratories, universities and International laboratories. Tokamak devices such as the planned International Thermonuclear Experimental Reactor ("ITER") in Cadarache, France are nearly steady state devices, premier US devices are Sandia National Laboratory's Z Machine, a 26 million Ampere wire Z pinch, and Sandia's new liner implosion experiment, MagLIF, ("Magnetic Liner Implosion Fusion") both high energy density ("HED") devices that operate on a 100 nanosecond time scale and reach thermonuclear conditions. Devices in HED science seek to confine plasmas with magnetic pressures of 1 million atmospheres or 500 Tesla (5 megaGauss) magnetic fields. Experimental fusion devices range from cm size, nanosecond time scales for HED devices to 10s of meters, with second to minute time scales for tokamaks and each require the generation of specific magnetic topologies to operate successfully, representing two extremes in distributed (local) magnetic sensing technology.

a. Magnetic Sensing

In traditional MFE experiments, numerous discrete electrical magnetic field sensors are placed at the plasma edge to provide feedback to operate these plasmas and control their behavior. If possible, arrays of probes are placed just inside the plasma protected within a cladding material if the edge temperature is low enough or time duration short enough. These electrical sensors are facing significant challenges on many fronts (size, spatial resolution, bandwidth, sensitivity, electrical hazards and so on) on present plasma devices and for future planned devices.

An example where traditional induction based electrical sensors fail to provide a key measurement is ITER's planned installation of a fiber optic Rogowski diagnostic. An electrical Rogowski coil in the shape of a loop measures, by magnetic induction, the total current encircled by the loop, an integrated or global quantity. A fiber optic Rogowski performs the same global measurement optically. The fiber diagnostic can measure the current over an indefinitely long time whereas an electrical Rogowski fails in this regard. This is a first in this field.

Figure 1A:
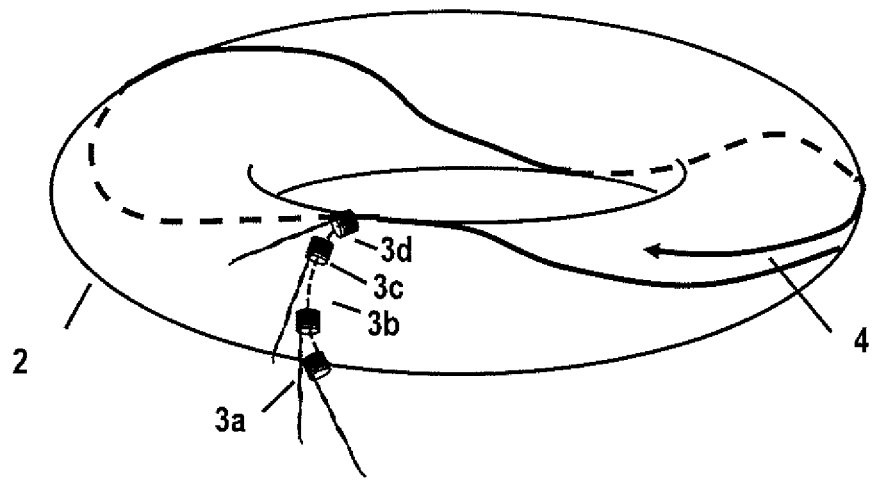
FIG. 1a shows a magnetic field topology at the edge of a tokamak device with a poloidal array of pickup coils to measure a local magnetic field.
Figure 1B:
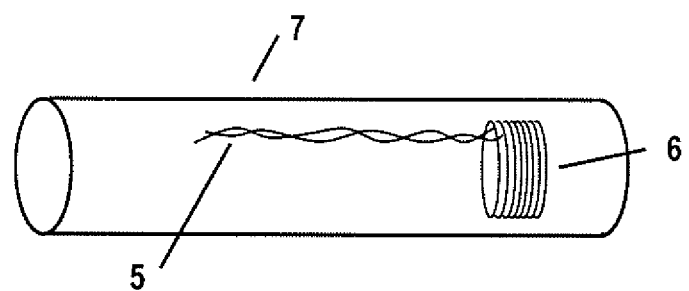
FIG. 1b shows a magnetic pickup coil in an electrostatic shield.

At present, local or spatially resolved magnetic sensing is performed using electrical magnetic pickup coils 6 as shown in FIG. 1*b*. A time history of the time rate of change of one component of the field at a fixed location is measured by magnetic induction. For static B fields, electrical probes are useless. The edge magnetic field distribution measured by arrays of pickup coils provide: an averaged distributed field, $<B(r_i)>$ and a short time scale fluctuating field distribution in time, $\delta B(r_i,t)$ at positions $r_i$, i=1, 2 ... N. These modal fluctuations in B can be used to diagnose the stability of the plasma. It is important to sense high mode numbers by using a large number of probes around a given loop. The amplitudes of the modes around a loop are labelled by n and m numbers as to the wavelength of the mode in the toroidal or poloidal direction around a plasma confinement device. A mode of m requires 2·m+1 probes around the loop to unambiguously resolve the mode. Poloidal modes with mode #s m>10 are not uncommon. When several poloidal and toroidal arrays are used, the number of electrical connections to the control room from the plasma is daunting, in the hundreds. The measured $<B(r)>$ is a feedback signal for adjusting the plasma's field magnitude using the external drivers. Sophisticated real-time programs such as ("EFIT") (a magnetic equilibrium reconstruction code) compute the magnetic topologies from the measured fields to provide real-time feedback to adjust the plasma shape and position. The shapes are becoming more complex requiring more measurements around the device. Electrical probes cannot measure static fields and are problematical for magnetically confined plasmas operating on long time scales, ITER will operate for 16 minutes and inductive based probes will be pushed to their limits. Implications are serious if the accuracy of the magnetic measurements worsen over time. In the field of plasma diagnostics, the answer is to build in redundancy of measurements so that one does not rely solely on one measurement technique. Fiber sensing compliments and outperforms inductive probes on long time scales. The next planned international tokamak, DEMO ("DEMOnstration power station"), will be a steady state reactor and electrical probes have severely limited application to DEMO. Fiber optic magnetic sensing is an alternative.

FIG. 1*a* shows the edge magnetic field topology of a tokamak plasma confinement device. The edge or vacuum magnetic field is contained (lies within) in a magnetic flux surface, 2, which has the topology of a torus. An illustration of a magnetic field line 4, in that surface is shown. The field line is helical having both a poloidal and a toroidal component and generally does not return upon itself after making one toroidal circuit. The poloidal component is given by the plasma's distributed toroidal current circling the torus. The toroidal current is driven inductively with an external driver and the current's magnitude and distribution is key to the performance of a tokamak plasma. Four electrical probes 3*a*-*b* are shown in FIG. 1*a* as part of a poloidal array consisting of regularly spaced pickup coils with their axes pointing in the poloidal direction (tangent to the flux surface) known as a Mirnov array for sensing temporal poloidal mode structures at the plasma's edge.

Electrical pickup coils measure magnetic field by induction using Faraday's law: the time rate of change of the magnetic flux, dϕ(t)/dt, over an area induces an electric field and therefore a voltage, V(t), in an electrical circuit enclosing that area as given by $$V_{probe}(t) = -\frac{d\phi}{dt} = -\frac{d\int\int \vec{B}\cdot \vec{ds}}{dt} = -\frac{d(B_\parallel \cdot N_w A_p)}{dt} \quad \text{Eq 1}$$

The area is the sum of the loop areas; the number of windings, $N_w$, times the area of one loop, $A_p$, and is called the ("NA") of the probe. The sensitivity of the probe is increased with larger NA. Typically, $N_w$ is 30 and a probe may have a radius of 6 mm for tokamaks (NA=30×10$^{-4}$ [m$^2$]) and 0.5 mm for a single loop HED pickup coil (NA=10$^{-6}$[m$^2$]). Integrating the probe voltage electronically produces, $V_{int}(t)$, a measurement of $B_\parallel(t)$ at $r_i$ as given by $$V_{int}(t) = -\int_o^t \frac{V_{probe}(t')}{RC} dt' = -\frac{N_w A_p}{RC} B_\parallel(t, r_i) \quad \text{Eq 2}$$

$$B_\parallel(t, r_i) = -\frac{RC}{N_w A_p} V_{int}(t) \quad \text{Eq 3}$$

R is a physical resistance and C a physical capacitance, RC is an integration time for the electronic integrator with units of time. If the electrical measurement is to be accurate for seconds then RC should be many seconds. But the integrated signal measurement, Eq 2, is reduced or attenuated by the value RC and so the small amplitude high frequency magnetic field signals may be too small to record. A mode amplitude, δB, for a magnetic field fluctuation might be 100 G producing a signal amplitude of only (NA=3×10$^{-3}$)·10$^{-2}$ T/(RC=1 s)=30 μV signal for a tokamak. This is a very weak signal. The solution is to make RC on the order of the period of fluctuations of interest, a millisecond for instance, then the attenuation factor of RC is much smaller but the long time scale magnetic field measurements suffer integrator droop and drop off scale. There is no good compromise for both high frequency and near DC sensing with induction based electrical probes. A probe for ITER with a 16 minute discharge time requires an RC time of an hour to work well and high frequency magnetic fluctuations would be lost.

One solution is to increase the NA of the coil with more windings. However, capacitive coupling between the windings becomes an issue, a frequency limiting resonance will move from very high frequency at low $N_w$ to lower frequency as $N_w$ is increased, a resonance typically in the 10's of MHz range for large coils with many turns. This resonance limits the usefulness of the probe for fluctuation measurements. Another solution is to increase the area, $A_p$, but the probe radius is usually severely constrained by access limitations together with the fact that the twisted pairs of wires return in spaces around the probes. One might double the number of probes, one set for high and another for low frequency measurements with twice the wire pairs. A shielded tube, FIG. 1*b*, 7, is necessary to minimize electrostatic coupling between the coils and the immediate electrical environment. This shield attenuates the magnetic field to be measured, an integration of the signal, further limiting the bandwidth of the measurement.

The transmission line 5 FIG. 1b used to transport the electrical signal from the probe to control room is a twisted pair of wires. A transmission line of 10s of meters represents a large capacitance which integrates the signal yet again. For HED plasma science, the probes are intimate to an electrical environment with voltages of megavolts and currents of megaamperes. Any unforeseen coupling between the probe circuit and the HV driver can bring lethal voltage into the control room. Notably, ground loops are an ever present problem with circuits that are intimate with each other. Simply stated, electrical pickup probes are simple to construct, robust and 'seemingly' inexpensive point field sensors but suffer from severe limitations because they are electrical in nature: electrical hazards, electrical noise, electronic hardware (filter, integrator, digitizer) multiplied by number of probes, bulky, limited frequency response for high and low frequencies and a spotty spatial coverage. Where magnetically confined plasmas are pushing the technology, electrical magnetic sensors are failing to keep up and crippling progress.

The ability to measure spatial distributions of intense magnetic fields as large as 100 Tesla remotely using light instead of electricity with large dynamic range, fast rise time (high bandwidth), at high spatial resolution, with high accuracy, and low electrical noise is the domain of fiber optic magnetic sensing. Fiber sensing represents a paradigm shift over induction based magnetic sensors. A considerable volume of wire is replaced with one fiber providing possibly unrivaled spatial resolution with less access restriction and more coverage. Electrical hazards are eliminated as well as banks of hundreds of integrators, filters and recorders which are replaced by 4 detectors and one signal recorder per fiber. As opposed to probes, the field response is linear from DC to very high bandwidths with an exceptional dynamic range in field magnitude. Fiber sensing has the potential to be a transformational technique for the whole of MFE science.

For tokamak devices, cm resolution over 10s of meters size is difficult to provide with discrete electrical probes as the number is preferably very high. For HED fusion devices, sub-mm resolutions over cm size is also difficult to accommodate using discrete magnetic sensors due to space constraints. Fiber sensing provides unrivaled coverage at both extremes of scale.

Tokamaks are now being built with steady state superconducting magnets considered to be the driving technology and future of the MFE field. Inductive based magnetic sensors cannot measure DC magnetic fields, fiber sensors can. Fiber optics is an optical solution to magnetic sensing allowing an electrically safe, remote interface between the control room and the experiment. Fiber optics can outperform inductive probes throughout the MFE field 'if' their ability to make robust distributed measurements can be considerably improved. This problem has now been solved with signals tens of thousands of times stronger than before at both extremes of scale. A determination of the magnetic field over 10's of meters with cm resolution or cm lengths with sub-mm resolution with excellent field resolution is now possible.

Fibers can also measure the magnetic field distributions in opaque magnetized media. A fiber is an insulator, generating no fields of its own, so the field in the fiber is that of the adjacent medium. With a diameter of 125 µm, the measured field is that of the medium in which the fiber is embedded to spatial variations on the order of ~125 µm. The local magnetic field can be measured in any magnetized medium in which the introduction of fibers is tolerated.

b. Magnetic Sensing Using the POTDR Technique

In the field of fiber sensing, a technique for a local measurement of a distributed influence along the fiber is to couple a spatially narrow light pulse into the fiber and deduce the spatial distribution of the influence along the fiber from the intensity of the backscattered light induced in the fiber by the pulse as it propagates in and along the fiber. The backward directed light may originate from breaks in the fiber and the distance to the break, s, from the start of the fiber is given by $s=v_f \delta t/2$, where $v_f$ is the propagation velocity of the pulse in the fiber, $v_f = c/N_1$, the speed of light c, divided by the fiber core refractive index $N_1$ (the fiber cladding has a slightly smaller index, $N_2$) and $\delta t$ is the time-of-flight between the pulse entering the fiber and the back-reflected light or echo from the break reaching the start of the fiber. This technique is known as Optical Time Domain Reflectometry ("OTDR"). If the pulse of light is conditioned to be in a definite state of polarization ("SOP") when coupled into the fiber then, for single mode fiber ("SMF"), the continuously echoed backscattered light due to induced Rayleigh scattering in the glass from the pulse encodes the progressive change in the SOP of the pulse as it propagates down the fiber. The wavelength, $\lambda$, is in the spectral region for which the fiber has only one mode of propagation, since competing modes will ruin the correlation of the polarization of the backscatter with the external influences along the fiber that are to be sensed. This technique is known as Polarization OTDR or POTDR. The distributed influence to the SOP of the pulse to be sensed can be the birefringence along the fiber that is intrinsic to the fiber or an externally applied stress, due to bending or scalar fields such as pressure and temperature variations along the fiber, or induced birefringence from the magneto- or electro-optic properties of the fiber produced by an external electric or magnetic field. These external and internal influences are manifested as progressive changes in pulse's SOP as observed in the SOP of the distributed Rayleigh backscatter. A polarization sensitive receiver (polarimeter or polarization state analyzer ("PSA")) analyzing the SOP of the backscatter is used to infer the SOP of the pulse at position, s, along the fiber given by time-of-flight and a model is used to quantify the influences that created these changes at s. A more general concept for distributed magnetic sensing in any remote optically transparent medium (including optical fibers) is known as Pulsed Polarimetry ("PP"). Pulsed polarimetry cannot measure magnetic fields in vacuum or air. A surrogate medium, such as an optical fiber can replace the vacuum. Optical fibers are ideal for pulsed polarimetry outside the plasma and the technique is known as Fiber Optic Pulsed Polarimetry. The technique of FOPP is synonymous with POTDR, with an emphasis to applications within the magnetized fusion sciences.

A magnetic field in a fiber from an external electrical current distribution induces a change to the SOP of the pulse due to the Faraday effect, a circular birefringence. Optically transparent media, with few exceptions, have this magneto-optic property. The strength of the Faraday effect is quantified by the fiber's Verdet constant, $V_f$. For silica, $V_f=260°/$ T-m at $\lambda=532$ nm. The plane of polarization (polarization azimuth) of the pulse will rotate at a constant rate of 260°/m as the pulse propagates in a SMF fiber with a constant 1 Tesla field in the direction of the fiber is present. For a general field distribution with $B_\parallel$ (component of B aligned to the fiber's axis) the progressive rotation, $\alpha_F$ to position s, due to the Faraday effect is given by $$\alpha_F(s) = \int_0^s V_f B_\parallel(l) dl \qquad \text{Eq 4}$$

The polarized light pulse will induce backscatter with a SOP inherited from the pulse within the scattering volume at s. A determination of the backscatter SOP yields $B_\parallel(s)$ as given by $$B_\parallel(s) = \frac{1}{(2)V_f} \frac{d\alpha_F(s)}{ds} \qquad \text{Eq 5}$$

The factor of 2 is due to the Faraday effect being non-reciprocal. The Faraday rotation is doubled as the backscatter retraces the path of the pulse back to the receiver. For SMF, there are two degenerate polarization states for the one single mode of the fiber, the left(L) and right(R) circularly polarized ("CP") states. The presence of a parallel magnetic field, $B_\parallel$, breaks the degeneracy by giving an offset velocity to the two CP states which produces a progressive phase shift with distance as the two states propagate along the fiber. The resulting phase shift between the states appears as a rotation in the light's plane of polarization upon exiting the fiber. Note that $B_\parallel$ is directly measured not $dB_\parallel/dt$. Electronic integrators and filters are eliminated.

Another magneto-optic effect that induces a change to the SOP of the pulse is the Cotton-Mouton effect. This produces a progressive linear birefringence or ellipticity along the fiber due a magnetic field oriented perpendicular to the axis of the fiber. For silica, the effect is too small to measure but for Terbium doped fibers the effect is measureable for very strong magnetic fields. Electric fields couple to the fiber through electro-optical effects such as the Pockels and Kerr effects which produce distributed birefringence but are weak for silica fibers.

FOPP (POTDR) suffers from low backscatter intensity. Fiber optic communications would not be possible otherwise. The energy produced from Rayleigh scattering over a distance L in a silica optical fiber is weak, given by $$E_{backscatter}(L) = E_o S_c (1 - \exp(-2 L/\lambda_f))/2 \qquad \text{Eq 6}$$

The decay length along the fiber at 532 nm is a very long $\lambda_f$ (400 m) and only a fraction $S_c$ (~0.005) of the induced Rayleigh scatter returns to the receiver, most leaving through the cladding. A pulse energy, $E_o=1$ µJ, returns only 12.5 picojoules over a length of 1 m. For measuring fields over 1 mm, only 13 femtoJoules of return energy is available.

This level of backscatter cannot be significantly improved by raising the pulse energy, $E_o$, as thresholds for non-linear processes such as stimulated Raman scattering, stimulated Brillouin scattering and fiber damage upset the technique well before healthy levels of backscatter are reached around 1 µJ. The signal level relative to noise ("SNR") can be improved by integrating the backscatter intensity for longer times but then the spatial localization of the measurement, $\delta s$, is adversely affected as $\delta s = v_f \tau/2$, where $\tau$ is the integration time of the receiver. The signal can also be improved by averaging over M pulses with the SNR improving by a factor of $\sqrt{M}$ but with the assumption that the quantity of interest is not changing in time for the duration of the M pulses. This is not the case for the plasma community. For sensing the distributed magnetic field along a fiber, the technique of FOPP has been relegated to spatial resolutions of 10's of cms with poor field resolution. FOPP using Rayleigh backscatter cannot be used in HED plasma science.

c. The Backscatter-Tailored Optical Fiber

The backscatter tailored optical fiber is a breakthrough in custom fibers and distributed sensing using the POTDR technique by essentially circumventing the limitation in pulse energy for conventional PODTR. Conventional PODTR would be a viable technique over distances smaller than 10 cm if optical fibers were not limited by input pulse energy. The limit of ~1 µJoule is fixed and due to the generation of nonlinear effects that spoil the technique and ultimately damage the fiber. This limitation is the reason that the technique has been stagnant for three decades. The backscatter tailored optical fiber increases the reflected energy level by several orders of magnitude over any other implementation of fiber sensing using the POTDR technique allowing robust measurements and fine spatial resolution for pulse energies substantially lower than 1 µJoule. Pulsed laser sources with millions of pulses per second can now be used. A laser with 100 million pulses per second and a pulse energy of 10 nJoule has a modest average output power of only 1 Watt. Using the photodiode detector technology, spatial resolutions of a few mm's and time resolutions of 10 nanoseconds are now possible providing nearly continuous measurements in both time and distance along the fiber.

The BTOF is an array of discrete deterministic fiber Bragg gratings ("FBG") written on a fiber. The FBGs are so-called 'deterministic' in that each relevant parameters are specified, the resonant wavelength, the FBG length, the reflection coefficient and the spacing between FBGs. Fiber Bragg gratings applied in this way does not lie outside the theory or require new technology to fabricate. The optical fiber is the substrate but the spacing can be one FBG per 100 microns or 1 per meter with the same characteristics, the same performance only the spatial resolution is 10,000 times higher for the 100 µm spacing. An array of deterministic FBGs becomes a deterministic reflective structure and the results are no less than stellar and allows a new class of detection in fiber sensing with potentially sub-mm spatial resolution. Fiber sensing has now caught up with measuring magnetic field distributions of extremely small size.

A single well-made or deterministic fiber Bragg grating acts as a near perfect partial plane reflecting element at a localized position with a defined reflection coefficient for a selected wavelength. An array of such FBGs would make a very efficient backscattered signal of any mathematically realizable design. The fiber core is the mechanical structure on which the array is laid out but there is no preferred FBG separation distance other than larger than the FBG. An array of N FBGs could be written in a cm or equally, in a meter with no difference in the specifications of the FBGs. Given an FBG array design, disparate spatial resolutions, large or small, are identical with the same backscattered energy, the same measurement quality, but the measurement is fine or coarse according to the FBG separation distance. By definition, a so-called "backscatter-tailored" optical fiber (BTOF) is a single mode fiber with an array of deterministic FBGs, calibrated for resonant wavelength, reflection coefficient, length and spacing producing a determined backscatter intensity distribution for a sufficiently narrow input light pulse at that wavelength. A deterministic FBG (DFBG) has a prescribed resonant wavelength, $\lambda$ reflection coefficient, $\tau$, and length $\Delta l$. The back-reflected energy profile for an array of DFBGs is completely determined with a return intensity per FBG spacing much stronger than Rayleigh by many orders of magnitude. Only by fully exploiting the available pulse energy can PODTR become successful to sub-mm distances. In single mode fiber (SMF) the light has only one mode (degenerate in two polarization states) in which to propagate in a back or forward direction. The DFBG retro-reflects a portion, r, of the forward propagating pulse energy into that one mode but propagating backwards along the fiber. No other modes are present to convert to. The back reflected pulse from the DFBG inherits the SOP of the forward propagating pulse at its position in the array. The SOP of the forward propagating pulse should be preserved and this has been shown to be the case.

The FBG reflection coefficient, r, cannot be as arbitrarily high as one would like. Suppose r were as high as 5%, then the pulse energy would be attenuated to zero by reflection for an array with less than 20 FBGs. In addition, a large percentage of the reflected energy would be re-reflected back into the forward direction as it propagates to the receiver. A compromise is struck between high reflected energy but not so high that 'multi-pathing' is a problem, that energy reaching the receiver does so with only one reflection along the fiber. These conditions are met with r ~0.2% or less and an array of several hundred FBGs or point measurements of B along the fiber for instance A backscatter tailored optical fiber was manufactured with the design specifications of r=0.25%, $\Delta l$=200 μm, resonant wavelength $\lambda$=532 nm, FBG spacing of $\Delta x$=2.5 mm over L=1 m in silica SMF by procedures and tested successfully.

The backscattered intensity, I(t) is the means by which the SOP of the pulse along the fiber and also the spectrum of light reflected by each DFBG is determined but the measurements themselves are insensitive to the absolute intensity. The SOP of the backscatter is given by the two angles, the polarization azimuth $\alpha$ (or $\psi$) and the ellipticity $\chi$, and the degree of polarization, p. These 3 parameters determine the SOP of the backscatter completely and are insensitive to I(t). For instance, if $\chi$=0 and p=1, the measured LP intensity, $I_{HP}(t)$ yields $\cos^2(\alpha(t)=I_{HP}(t)/I(t)$ where I(t) seems necessary. But if both $I_{HP}(t)$ and $I_{VP}(t)$ are measured then $\tan^2(\alpha(t))=I_{VP}(t)/I_{HP}(t)$ regardless of I(t) $(=I_{VP}(t)+_{HP}(t))$. The angles ($\alpha$, $\chi$) and p, are insensitive to I(t). Similarly, the spectral composition of I(t) is independent of I(t). The robustness of the FOPP technique is in large part due to its independence to the absolute intensity of the backscatter.

Some of the changes to the SOP of the light pulse along the fiber might be attributed to the fiber rather than the influence to be measured. The SOP is measured with a 4 channel Stokes vector polarimeter and the magnetic field sensing is done relative to a baseline characterization of the SOP previous to the turning on the magnetic field.

Attributes of the BTOF

Figure 2:
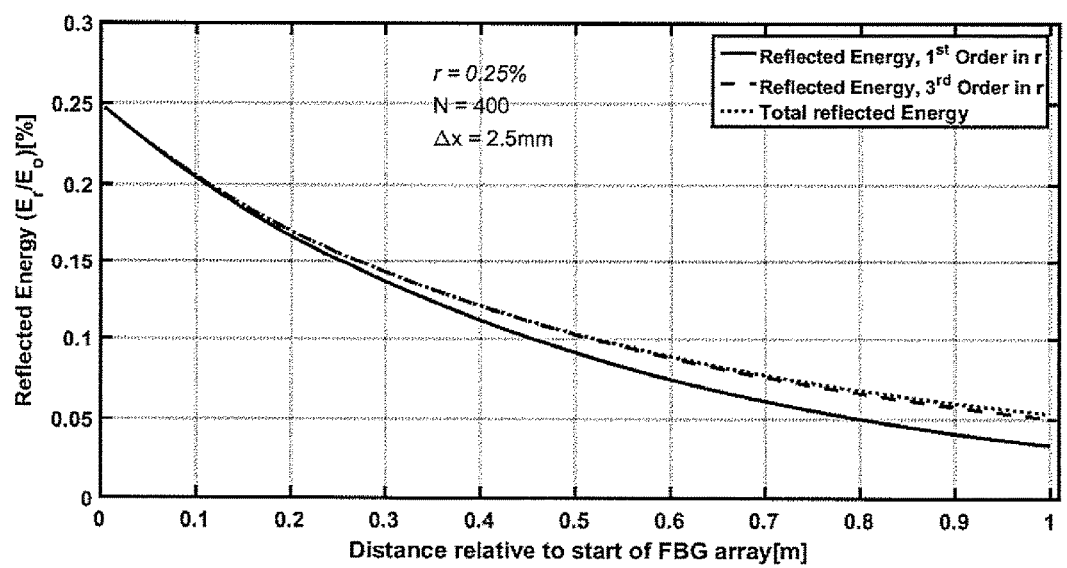
FIG. 2 is a graph of a distribution of back reflected energy of a backscatter tailored optical fiber with constant reflection coefficient of approximately 0.25%.

An array with uniform reflection coefficient has simple properties. The reflected energy distribution is given $$E_r(i\Delta t) = E_o r(1-r)^{2i} \text{ for } i=0, \ldots 399 \quad \text{Eq 7}$$

with $\Delta t = 2\Delta x/v_f$ (=25 ps), over 10 ns for L of 1 m. $E_r(t)$ is a discretely stepped approximation to a continuous exponential decay $E(t)=E_o r \exp(-t/\alpha_f)$ with a fiber decay length, $\alpha_f=\Delta x/(2r)$. In other words, the BTOF behaves approximately the same as a fiber without an array but with a decay length of $\Delta x/(2r)$ (=0.5 m). This is a much stronger decay than that due to Rayleigh, 400 m. FIG. 2 is a plot the reflected energy distribution for the $1^{st}$ order (one reflection) reflected energy. The abscissa could stand for 5 cm or 10 m instead of 1 m. The only difference would be $\Delta x$. In this way, the same BTOF design accommodates scale lengths from large tokamak plasmas with 400 measurements over 10 m or HED plasmas with 400 measurements over 2 cms.

Spatial resolution is set by $\Delta x$. The backscatter is composed of discrete temporal reflections separated in time by $\Delta t=\Delta x(10 \text{ ns/m})$ (=25 ps). If the polarimeter receiver has a response time $\tau>\Delta t$, the back-reflected signal will appear as a continuous signal of overlapping light pulses instead of discrete bursts of light. If $\tau<\Delta t$, discrete burst of light will be observed, but polarimetric measurements A determination of B does not depend on intensity. The polarimeter measures angles based on ratios of intensities. The quality of the measurements, however, improve with higher absolute intensity. The electronic bandwidth (BW) of the detector and $\tau$ are related by BW=920[GHz·ps]/$\tau$. A $\tau$ of 50 ps is a BW of 18 GHz which corresponds to a spatial resolution $\delta s$ of 2.5 mm, ($\delta s=v_f\tau/2$). The laser pulse duration, $\delta t_{pulse}$, is shorter than $\tau$ to achieve this. The laser pulse length in the fiber should be less than $\Delta x$, in general, to avoid overlap of the pulse with two or more FBGs.

Efficiency of technique is near perfect. The total reflected energy is given by $$E_{r,total} = E_o \Sigma_{i=0}^{399} r(1-r)^{2i} = 0.43 E_o \text{ to } 1^{th} \text{ order in } r \quad \text{Eq 8}$$

Nearly 50% of the input energy (43%) is available for measurement. This is the case for backscatter-tailored optical fibers with uniform r. If r is weaker then N is increased to approach the 50% level. For N>(1/r) nearly 50% efficiency is realized. Some of the energy goes past the last FBG. The remaining factor of two is not significant.

Quality of the measurement is high independent of spatial resolution. $E_{r,total}$ is distributed over N FBGs. The average reflected energy per FBG is 43%/400 or ~0.1% of $E_o$. The maximum input pulse energy without causing fiber damage for silica single mode fiber at 532 nm is ~1 μJ. A pulse energy of 1 μJ contains $3\times10^{12}$ photons for an average of $3\times10^9$ reflected photons per FBG. A polarimeter has a 25% throughput due to the directional coupler. With $3\times10^9/4$ photons, the Shot limited SNR is given by $\sqrt{(3\times10^9/4)}$:1=3× $10^4$:1. A high rep laser, $r_{laser}$=50 MHz, may have a pulse energy of only 1 nJ which yields a SNR of $10^3$:1, a measurement resolution of 1 part in 1,000 or 0.1%. This is possible because this backscatter-tailored optical fiber is 34,000× brighter than an equivalent silica fiber using Rayleigh. If $\Delta x$ is reduced to 0.25 mm, the array is 340,000× but the SNR level is exactly the same, (1000:1). The reflected energy per FBG doesn't change. A well-built polarimeter has an angular resolution of $\Delta \alpha$=0.1° equivalent to a SNR of 600:1. Pulse energies of 1 nJoule pulse energy do not limit the SNR, the polarimeter instrument does.

Magnetic field sensitivity and accuracy is well covered by extant fiber optic materials. The magnetic field resolution, given a field amplitude and spatial resolution $\delta s$, depends on the Verdet coefficient of the fiber, $V_f$. SMFs are produced in a variety of different glass compositions, silica being the most prevalent. For silica $V_f$ is 260°/T–m at 532 nm or 520°/T–m for FOPP once the factor of 2 is included. The wavelength dependence of $V_f$ is $1/\lambda^2$, increasing at shorter wavelengths. Fibers in the communications band at 1.5 μm have a weaker Faraday response by ⅑. Other fiber compositions, notably Tb-doped glass (also known as Faraday glass) have 20× the Faraday response over silica or 104°/T–cm. Typically, the field magnitude for a tokamak confinement device is 1 T. A Tb-doped fiber would have a response of 520° (5 cm×104°/T–cm) at 532 nm with $\delta s$ of 5 cm and a 58° response at 1.5 μm. Changes in $\alpha_F$, $\Delta \alpha_F$ greater than 90° between FBGs introduce ambiguities so either a finer spatial resolution $\delta s$<5 cm or a lower $V_f$ is used to keep $\Delta \alpha_F$ below 90°. The field resolution assuming a limiting $\Delta \alpha$ of 0.1° due to the polarimeter instrument is 1 part in 580 (58°/0.1°) for the 1.5 μm source or 17 Gauss (1.7 milli-Tesla) over 5 cm. The field resolution is 1 part in 5,200)(520°/0.1°) at 532 nm but then the density of FBGs increases by 10, or $\Delta x$=5 mm to keep $\Delta \alpha_F$ below 90°. For HED devices, the field magnitude can be greater at 100 T (1 megaGauss), a δs of 0.5 mm in silica SMF at 532 nm would have a rotation of 26° and a magnetic field resolution of 1 part in 260(26°/0.1°) or ~0.38 T. The MFE and HED devices are well covered by silica and Tb-doped optical fibers.

A new regime of nonlinear behavior is obtained using a large r which produces large multi-pathing effects. The total transmitted energy is given $$E_{trans,tot} = E_o \sum_1^N (1-r)^i = 0.37 E_o \qquad \text{Eq 9}$$

The sum of the total reflected and transmitted energy is 80% of the input pulse energy $E_o$. Eq's 8 and 9 are accurate to $1^{st}(r)$ and $0^{th}(1)$ order in r respectively, accounting for pulse trajectories along the fiber with one reflection and no reflections. The 20% of $E_o$ is accounted for by paths of $3^{rd}(r^3)$ and $2^{nd}(r^2)$ order and higher for reflected and transmitted energy. Even though these paths are reduced in amplitude by $r^2$, the number of paths increases rapidly with number of FBGs or distance along the array. The reflected energy with time for each order of r was calculated and for this case, multi-pathing produces a 2% increase at 20 cm and ~50% increase at 1 m in reflected energy over the desired signal first order reflection signal as shown in FIG. 2. Third order reflections corrupt the locality of the measurement and a 50% level of spurious signal is intolerable. Effects due to multi-pathing can be reduced by either reducing r (an r of 0.04% produces less than 1% error at 1 m but reduces the SNR) or using a limited length of fiber as the multi-pathing accumulates heavily at the end.

Dynamic range of backscatter can be eliminated. A problem of a BTOF with uniform r is the exponential drop in signal level with distance, a decay length $\Delta x/2r$ or 0.5 m in this case as shown in FIG. 2. A flat return is desirable for some detectors that have limited dynamic range. If the reflection coefficients increase with distance, the back reflected energy profile can be leveled. A prescription for a flat BTOF was mathematically generated as shown in FIG. 7 together with the result. The pulse energy is exhausted in 200 FBGs over 0.5 m as $r_1$ starts at 0.1% and $r_{200}$ increases to 0.25%, an exponentially increasing sequence. L of 0.5 m is arbitrary. This design is now settled or any length of fiber by $\Delta x$, $L=200\Delta x$, with $\Delta x$ arbitrary. A flat return might also be achieved by using rare-earth doped fibers that have gain when pumped with a CW laser coupled into the fiber along with the pulse.

Near continuous space-time resolved field distributions are obtained. The goal is to measure B to the spatial and temporal resolution demanded by the application. For HED science, spatial resolutions<100 μm are of interest and time scales of nanoseconds. The backscatter-tailored optical fiber produces the same SNR at 100 μm as at 2.5 mm spacing, 34,000× Rayleigh at 2.5 mm but ~1 million times Rayleigh at 100 μm. A streak camera is an optical receiver having the lowest response time, τ as low as 1 ps (BW=0.92 THz) which corresponds to a δs<100 μm. Streak cameras use a photocathode material to convert light to an electron beam with current directly proportional to the light intensity. The photocathode has a lower quantum efficiency (5-20%) than photodiodes (90%) and as mentioned before the return signal over a 100 μm interval using Rayleigh scatter is too low for any detector but with a 34,000× enhancement over Rayleigh, streak cameras detection is possible. The beam is swung across a phosphor screen using deflection plates with a high slew rate in the applied voltage producing streaks measured in rates of mm/ps. A digital camera image of the fluorescing phosphor gives a direct measure of the intensity vs time to ps resolutions. Robust streak camera detection of BTOF backscatter has now been demonstrated, for the first time. Spatial resolutions of 100 μm are now possible. The BTOF opens up a whole new arena of field sensing for HED magnetized plasmas. These photocathode devices only operate in the visible but not in the near-IR where photodiodes can operate. For this reason, a wavelength of 532 nm was chosen so that the first BTOF measurement could be performed using a streak camera. A streak camera is a single shot device but several fiber systems can be coupled into the same streak camera for the one acquisition. By splitting the laser pulse several ways and incorporating fiber delays to the region of interest and synchronizing fiber delays back to streak camera, simultaneous measurements of magnetic fields displaced in time by 0 to 10's of ns can be performed. Plasma dynamics resolved to nanoseconds in addition to the 100 μm spatial resolutions is achieved. The field magnitudes (100 T) is so high that silica fibers can be used with 100 μm resolutions producing robust measurements. For MFE science, the spatial resolutions are less demanding, 0.5-10 cm, but the dynamics can be fast. High rep pulsed lasers at 50 MHz rates providing 20 ns time resolution were formerly too weak in pulse energy to be applied to a photodiode POTDR system but with BTOF, this system is robust and can provide field measurements resolved to mm's and 20 ns with excellent SNR using Tb doped fiber at these lower field magnitudes of 1 T or less. Near continuous space-time measurements of $B_{11}$ are provided for both HED and MFE plasma sciences.

Evidence

A backscatter tailored optical fiber was constructed with a reflection coefficient of 0.25% and 400 FBGs per meter. The working wavelength of 532 nm is green and which allowed the construction of a streak camera FOPP system as in FIG. 4. For the first time, backscatter or back reflection in this case, was strong enough to be observed using a photocathode devices such as a streak camera. The results confirmed that the reflections from the FBGs do not corrupt the state of the polarization of the propagating pulse and the magnetic field distribution was measured along the fiber agreeing with the applied field. The signal to noise ratio was high, over 1000:1 even in this most demanding demonstration of POTDR using a backscatter tailored optical fiber and the fastest detection system. This demonstrates that sub-mm spatial resolution with excellent SNR are possible are possible which can resolve magnetic field structures in the most demanding applications.

Advantages of POTDR using a Backscatter Tailored Optical Fiber

Key advantages and exceptional attributes described above over other magnetic sensing techniques using discrete pickup coils are summarized below.

A working PODTR system of practical utility for the sensing of magnetic fields along a fiber can be realized with an input laser pulse energy less than the pulse energy limitation of optical fiber at 1 μJoule for any spatial resolution. This opens up new PODTR systems based on using streak camera or photomultiplier detectors for the low light levels and using high repetition rate lasers with many pulses with energy below 1 μJoule.

Provides near continuous spatially resolved magnetic field measurement. The information in a distributed measurement immeasurably outweighs those of discrete measurements. Field behavior is (1) provided on a spatial scale that is physically unobtainable using discrete coils, (2) a tremendous bulk of wires, shields and coils is replaced by thin fibers allowing more fiber sensors and more coverage and more accessibility, (3) one fiber sensor consists of a four channel Stokes polarimeter which replaces 100s of single channel digitizers, filters and data recorders, (4) the bandwidths of the fiber sensing can be in the 100 MHz range and mm spatial resolution using one fiber with a high rep rate laser.

Provides remote sensing of the magnetic fields in opaque magnetized media. Wherever optical fiber can be introduced and tolerated in a medium, the local magnetic field of that medium can be sensed. The small diameter of an optical fiber and insulating properties imply that the optical fiber will not electrically perturb the fields being measured and will be so intimate to the medium that magnetic dynamics on a spatial scale of a few fiber diameters ~250 µm, can be measured, for the first time. The optical fiber represents the least intrusion (size, chemical inertness, temperature tolerant) for probing regions of space where magnetic fields are present, even in biological systems. And the sensitivity to small amplitude magnetic fields is high.

Remote sensing capability. Fibers interface with the region of interest optically and the fiber is an insulator. The distance between the instrument and region where the field is to be sensed can be 10s of meters to kilometers. The device of magnetic fusion science produce radiation hazards and high voltage hazards and remote sensing without the use of wire connections is paramount.

Resolves dynamics. Very high temporal bandwidths can be obtained by multiplexing fibers. Two fibers next to each other but displaced in time can resolved the dynamics of the magnetic field to arbitrary temporal increments. This is particularly important in the streak camera FOPP instrument in FIG. 4, where the laser source is single pulse and several magnetic field distributions can be recorded in the streak camera if several fiber sensors are used with fiber delays and synchronously multiplexed together in the detector. Also, high repetition rate lasers with rep rates of 10's of MHz are available, more temporal bandwidth is provided by multiplexing fibers with staggered or delayed pulses next to each other to increase the time resolution. Near continuous measurements of B(r,t) are provided in both space and time for either single pulse streak camera applications or high pulse rep rate applications.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A system to measure a position of an electric field or a magnetic field, the system comprising:
    a light source configured to emit a polarized light pulse;
    a backscatter tailored optical fiber to be placed within the field, and positioned to receive the polarized light pulse, the backscatter tailored optical fiber including an array of discrete fiber Bragg gratings to produce a backscatter pulse composed of a sequence of retro-reflected reflections of light from the array of fiber Bragg gratings in response to receiving the polarized light pulse;
    a polarimeter to receive the backscatter pulse and produce four Stokes vector polarization component intensities; and
    a streak camera configured to receive the four Stokes vector component intensities and generate up to four intensity patterns on a screen, each intensity pattern corresponding to one of the four Stokes vector polarization component intensities, wherein the intensity patterns reveal a state of polarization of the backscatter pulse and the position where the field is located along the backscatter tailored optical fiber.

2. The system of claim 1 wherein the polarimeter includes photomultiplier detectors.

3. The system of claim 1 wherein the backscatter tailored optical fiber comprises a terbium doped backscatter tailored optical fiber.

4. The system of claim 1 wherein the backscatter tailored optical fiber exhibits gain of the polarized light pulse with distance along the backscatter tailored optical fiber.

5. The system of claim 1 wherein two lasers are with two different wavelengths source light into the system and the backscatter tailored optical fiber has fiber Bragg gratings that are resonant at both wavelengths with respective calibrations of reflection coefficient, length and array spacing.

6. The system of claim 1 wherein the laser sources a light pulse of polarization of an arbitrary elliptical polarized state.

7. The system of claim 1 wherein the light source comprises multiple lasers to inject multiple polarized light pulses of different wavelengths or different polarization states, the multiple polarized light pulses offset in time or staggered so that any two backscatter pulses of the same wavelength are not analyzed at the time by the polarization state analyzer.

8. The system of claim 1 wherein multiple backscatter tailored optical fibers receive the same polarized light pulse from the source, the multiple backscatter tailored optical fibers positioned to introduce a single mode fiber delay before the backscatter tailored optical fibers so that a field distribution measured is offset in time.

9. The system of claim 1 wherein the field is an electric field.

10. The system of claim 1 wherein the field is a magnetic field.

11. A system to measure a position of an electric field or a magnetic field, the system comprising:
    a laser configured to emit polarized light pulses at more than one million pulses per second with pulse energies of less than one micro Joule;
    a backscatter tailored optical fiber to be placed within the field and positioned to receive the polarized light pulses, the backscatter tailored optical fiber including an array of discrete fiber Bragg gratings to produce a backscatter pulse composed of a sequence of retro-reflected reflections of light from the array of fiber Bragg gratings in response to receiving each of the polarized light pulses; and
    a polarimeter to receive the backscatter pulses and produce up to four Stokes vector polarization component intensities, wherein the Stokes vector polarization component intensities reveal a state of polarization of the backscatter pulse and the position where the field is located along the backscatter tailored optical fiber.

12. The system of claim 11 wherein the polarimeter comprises four solid state photodetectors that detect four Stokes vector polarization components in the backscatter pulse to produce the four Stokes vector components intensities.

13. The system of claim 11 wherein the backscatter tailored optical fiber comprises a terbium doped backscatter tailored optical fiber.

14. The system of claim 11 wherein the backscatter tailored optical fiber exhibits gain of the polarized light pulse with distance along the backscatter tailored optical fiber.

15. The system of claim 11 wherein two lasers are with two different wavelengths source light into the system and the backscatter tailored optical fiber has fiber Bragg gratings that are resonant at both wavelengths with respective calibrations of reflection coefficient, length and array spacing.

16. The system of claim 11 wherein the laser sources a light pulse of polarization of an arbitrary elliptical polarized state.

17. The system of claim 11 wherein the light source comprises multiple lasers to inject multiple polarized light pulses of different wavelengths or different polarization states, the multiple polarized light pulses offset in time or staggered so that any two backscatter pulses of the same wavelength are not analyzed at the time by the polarization state analyzer.

18. The system of claim 11 wherein multiple backscatter tailored optical fibers receive the same polarized light pulse from the source, the multiple backscatter tailored optical fibers positioned to introduce a single mode fiber delay before the backscatter tailored optical fibers so that a field distribution measured is offset in time.

19. The system of claim 11 wherein the field is an electric field.

20. The system of claim 11 wherein the field is a magnetic field.

\* \* \* \* \*